US009064852B1

(12) United States Patent
Hardesty (10) Patent No.: US 9,064,852 B1
(45) Date of Patent: Jun. 23, 2015

(54) THERMAL PYROLYTIC GRAPHITE ENHANCED COMPONENTS

(75) Inventor: Robert E. Hardesty, Danville, CA (US)

(73) Assignee: The Peregrine Falcon Corporation, Pleasanton, CA (US)

( * ) Notice: Subject to any disclaimer, the term of this patent is extended or adjusted under 35 U.S.C. 154(b) by 635 days.

(21) Appl. No.: 13/310,947

(22) Filed: Dec. 5, 2011

(51) Int. Cl.
*B21D 39/00* (2006.01)
*H01L 21/48* (2006.01)
*H01L 23/367* (2006.01)

(52) U.S. Cl.
CPC .......... *H01L 21/4871* (2013.01); *H01L 23/367* (2013.01)

(58) Field of Classification Search
None
See application file for complete search history.

(56) References Cited

U.S. PATENT DOCUMENTS

| 4,059,217 | A | | 11/1977 | Woodward | |
|---|---|---|---|---|---|
| 5,578,146 | A | * | 11/1996 | Grant et al. | 148/437 |
| 5,876,831 | A | | 3/1999 | Rawal | |
| 6,131,651 | A | | 10/2000 | Richey, III | |
| 6,720,086 | B1 | | 4/2004 | Strutt | |
| 8,043,703 | B2 | * | 10/2011 | Cornie et al. | 428/408 |
| 2008/0019097 | A1 | | 1/2008 | Zhang et al. | |
| 2009/0165302 | A1 | * | 7/2009 | Slaton et al. | 29/890.054 |
| 2009/0169410 | A1 | * | 7/2009 | Slaton et al. | 419/9 |
| 2011/0139404 | A1 | | 6/2011 | Reddy et al. | |

FOREIGN PATENT DOCUMENTS

EP 2177638 * 4/2010

* cited by examiner

*Primary Examiner* — Mark Ruthkosky
*Assistant Examiner* — Daniel J Schleis
(74) *Attorney, Agent, or Firm* — Thomas Schneck (57) ABSTRACT

A thermally conductive composite material, a thermal transfer device made of the material, and a method for making the material are disclosed. Apertures or depressions are formed in aluminum or aluminum alloy. Plugs are formed of thermal pyrolytic graphite. An amount of silicon sufficient for liquid interface diffusion bonding is applied, for example by vapor deposition or use of aluminum silicon alloy foil. The plugs are inserted in the apertures or depressions. Bonding energy is applied, for example by applying pressure and heat using a hot isostatic press. The thermal pyrolytic graphite, aluminum or aluminum alloy and silicon form a eutectic alloy. As a result, the plugs are bonded into the apertures or depressions. The composite material can be machined to produce finished devices such as the thermal transfer device. Thermally conductive planes of the thermal pyrolytic graphite plugs may be aligned in parallel to present a thermal conduction path.

11 Claims, 7 Drawing Sheets

THERMAL PYROLYTIC GRAPHITE ENHANCED COMPONENTS

STATEMENT REGARDING FEDERALLY SPONSORED RESEARCH OR DEVELOPMENT

This invention was made with Government support under NASA contract NNX09C878C awarded by NASA/Jet Propulsion Laboratory. The government has certain rights in the invention.

TECHNICAL FIELD

The present disclosure pertains to thermally conductive composite materials and further pertains to liquid interface diffusion bonding.

BACKGROUND

Aluminum and various aluminum alloys have long been used for applications in which physical strength and thermal conductivity are desired. Examples include aluminum radiators, aluminum finning on air cooled engines, aluminum finned heatsinks for electrical components, aluminum alloy thermal transfer members in heat pumps and so on.

Thermal pyrolytic graphite has a much greater thermal conductivity than aluminum alloys, but lacks the physical strength of aluminum. The thermal conductivity of thermal pyrolytic graphite is highly directional, and is much greater in directions parallel to the planes of graphene that make up the material than in a direction perpendicular to the planes of graphene.

Thermally conductive composite materials combining thermal pyrolytic graphite and another material are known. U.S. Pat. No. 5,876,831 shows thermal plugs made of pyrolytic graphite or other carbon materials inserted into cells of a honeycomb core made of aluminum or aluminum alloys. US Patent Application Publication No. 2008/0019097 shows a resin matrix surrounding strips, channels, blocks, bars, cylinders or geometric shapes such as hexagons which may be of thermal pyrolytic graphite. U.S. Pat. No. 6,131,651 shows a flexible heat transfer device having a sandwich formed by a sheet of pyrolytic graphite between sheets of metallic composition. A diffusion bond between face sheets and core material can be formed under pressure and/or temperature. Further improvements in thermally conductive composite materials are sought.

SUMMARY

A thermally conductive composite material, a method for making same, and a thermal transfer device made of the material are herein disclosed. The thermally conductive composite material includes an aluminum or aluminum alloy member. Discrete plugs are embedded in the aluminum or aluminum alloy member. The plugs are made of thermal pyrolytic graphite. The plugs are secured to the aluminum or aluminum alloy member by an eutectic alloy interface. The eutectic alloy interface is formed by the aluminum or aluminum alloy, the thermal pyrolytic graphite and silicon.

The thermal transfer device has an aluminum or aluminum alloy member. A plurality of thermal pyrolytic graphite members are at selected positions in the aluminum or aluminum alloy member. The thermal pyrolytic graphite members are bonded to the aluminum or aluminum alloy member. Thermally conductive planes of the thermal pyrolytic graphite members are substantially parallel. The planes are parallel such that at least one major thermal conduction path is presented that traverses plural ones of the thermal pyrolytic graphite members and boundaries therebetween in series.

The method for making a thermally conductive composite material uses a blank of aluminum or aluminum alloy, which is formed having a plurality of depressions therein or apertures therethrough. Plugs are inserted into the depressions or apertures. The plugs are made of thermal pyrolytic graphite. An amount of silicon is applied to the plugs and the depressions or apertures. The amount of silicon is sufficient for liquid interface diffusion bonding. Bonding energy is applied to the blank of aluminum or aluminum alloy with the inserted plugs. The binding energy is applied so that the thermal pyrolytic graphite, the aluminum or aluminum alloy and the silicon form a eutectic alloy. The eutectic alloy bonds the plugs into the apertures or depressions as a result of the liquid interface diffusion bonding.

DETAILED DESCRIPTION

Figure 1:
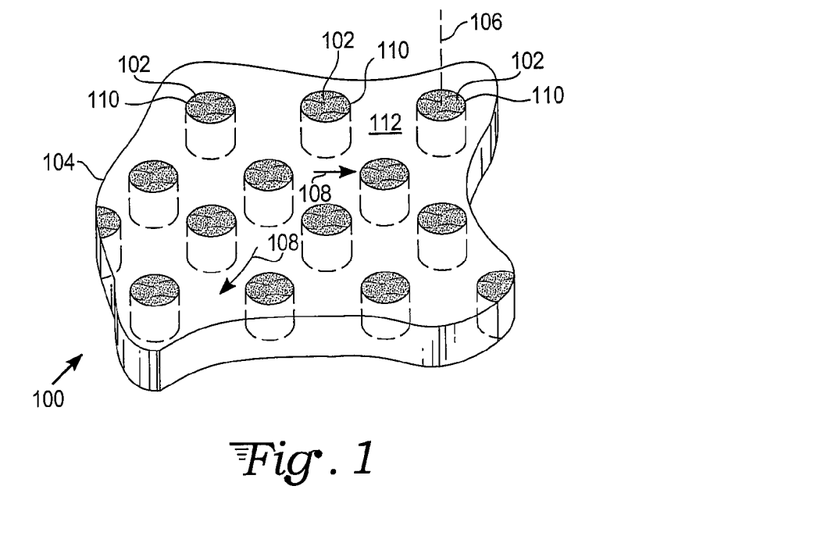
FIG. 1 is a perspective view of a composite material with high thermal conductivity, having thermal pyrolytic graphite plugs embedded in an aluminum-beryllium alloy, in accordance with the present invention.

With reference to FIG. 1, a thermally conductive composite material 100 in accordance with the present invention is shown. The composite material 100 has both physical strength and heat conducting properties, including directional high thermal conductivity, and is formed by embedding thermal pyrolytic graphite plugs 102 in an aluminum beryllium alloy member 104. Further embodiments of the thermally conductive composite material 100 use aluminum or other aluminum alloys. Suitable for use in aerospace and commercial applications, the material can be formed in bulk and later machined into finished products and devices such as thermal transfer members. For example, a thermal transfer member transfers heat from a heat source to a heat dissipating or removing surface or unit.

The thermally conductive composite material is created by embedding a plurality of thermal pyrolytic graphite plugs 102, slugs or inlays into a corresponding plurality of apertures 110 in a plate or other member 104 made of aluminum beryllium alloy, the central axis 106 of each aperture 110 extending perpendicular to a surface 112 of the composite material 100 and being orthogonal to a direction 108 of heat transfer in the composite material 100. The thermal pyrolytic graphite inserts form an array, with the aluminum beryllium alloy forming a frame or macroscopic matrix in which the thermal pyrolytic graphite inserts are embedded and bonded. By having discrete inserts of thermal pyrolytic graphite, as opposed to a continuous extent of thermal pyrolytic graphite, the composite material presents major thermal conduction paths that traverse or go across plural discontinuous extents of the thermal pyrolytic graphite in succession while presenting a physical strength approaching that of the aluminum beryllium alloy. Depending on the spacing and placement of the thermal pyrolytic graphite plugs 102, the thermal conduction paths can be singly- or multi-directional on a two-dimensional basis. The thermal pyrolytic graphite plugs 102 can be arranged in a pattern and/or at an areal density so as to satisfy a selected thermal conductivity. The thermally conductive material can take the shape of a conduction bar or other heat transferring member and be applied for example in aerospace cryocoolers, such as between a warm load pr other heat source and a heat dissipating unit such as a heat pipe or a heat sink.

A liquid interface diffusion bonding process uses a thin layer of silicon as an intermediate material compatible to both the thermal pyrolytic graphite and the aluminum beryllium alloy, to create a metallurgical bond with these materials under applied pressure and temperature. A method of manufacture, a material and an example product are disclosed.

In one embodiment, an amount of silicon sufficient for liquid interface diffusion bonding is placed at the boundary or interface between the thermal pyrolytic graphite and the aluminum beryllium alloy, for each of the plugs. Silicon lowers the melting point of aluminum and has an affinity for both the aluminum and the graphite. By themselves, thermal pyrolytic graphite and aluminum beryllium alloy do not readily metallurgically bind to each other. Previous attempts at combining these materials have relied on mechanical methods such as crimping, encapsulating or fastening. The added silicon in the present embodiment provides an intermediate layer of material that is compatible to both the thermal pyrolytic graphite and the aluminum beryllium alloy, to create a metallurgical bond under pressure and temperature. In so doing, the total residual silicon material after the liquid interface diffusion bonding is in the range of microns in thickness around each piece of thermal pyrolytic graphite, which layer is thin enough that it has a minimal effect on thermal transfer but provides improved structural integrity to the interface. Bonding energy is supplied for the process by applying pressure and temperature using a hot isostatic press. Under sufficient conditions, the silicon and the aluminum beryllium alloy form a eutectic alloy that fuses the thermal pyrolytic graphite and the aluminum beryllium alloy.

There are multiple ways in which the placement of silicon can be accomplished. In one embodiment, silicon is deposited into apertures 110 in the aluminum beryllium alloy, using vapor deposition. The apertures 110 are dimensioned for a close fit, and the inserted thermal pyrolytic graphite plugs 102 make a close contact with the deposited silicon.

In a further embodiment, an aluminum silicon alloy foil is wrapped around each of the thermal pyrolytic graphite plugs. The foil-wrapped plugs 102 are then inserted into close-fitting apertures 110 in the aluminum beryllium alloy. Foil can be inserted into the apertures 110 prior to insertion of the plugs 102, in a still further embodiment.

In a yet further embodiment, silicon is deposited on the thermal pyrolytic graphite plugs 102 using vapor deposition. The plugs 102 are then inserted into close-fitting apertures 110 in the aluminum beryllium alloy.

In embodiments where the silicon is applied by vapor deposition, a thickness of about 1 micron is a recommended minimum, a thickness of about 10 microns or more is preferred, and greater thicknesses can be used. In one embodiment, a vapor deposition of silicon is used in a range of up to 50 microns. In embodiments where the silicon is applied by aluminum silicon foil, the thickness of the foil can be much greater.

Figure 2:
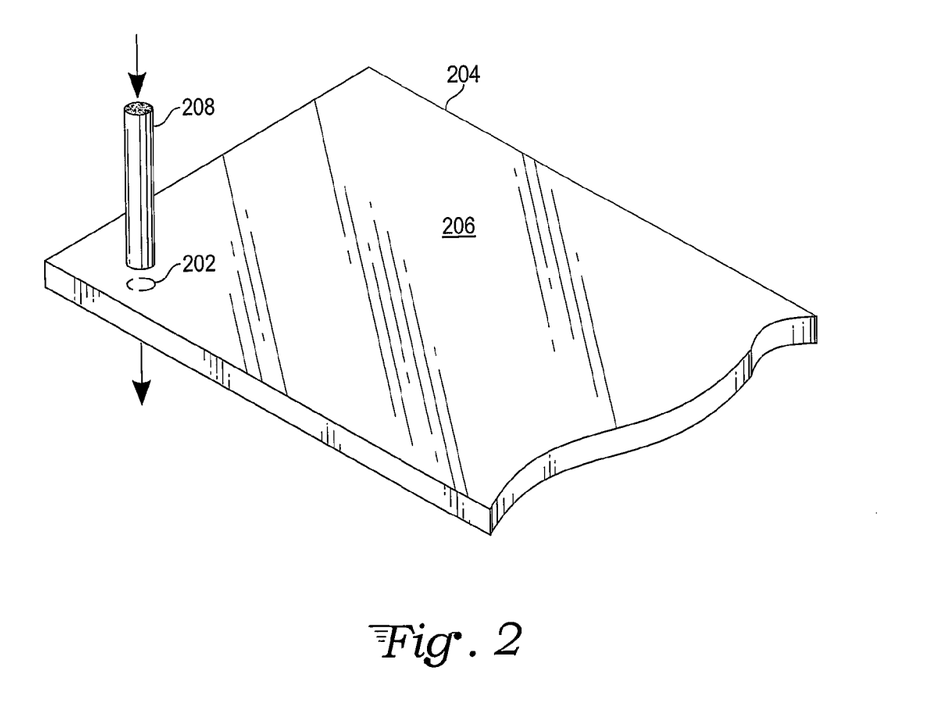
FIG. 2 is a perspective view showing the formation of thermal pyrolytic graphite plugs as used in the composite material of FIG. 1.

With reference to FIG. 2, in one embodiment the thermal pyrolytic graphite plugs 202 are formed from a sheet 204 of thermal pyrolytic graphite. Such sheets are commercially available. Thermal pyrolytic graphite has thermally conductive planes of graphene stacked in layers parallel to the front surface 206 or back surface (not shown) of the sheet 204, and is highly thermally conductive in directions and paths parallel to these planes. Thermal conductivity perpendicular to the planes, i.e. perpendicular to the front surface 206 or back surface of the sheet 204, is very low. Thus, there is a two-dimensional basis for thermal conduction paths when the planes of graphene are aligned in parallel, in the array of thermal pyrolytic graphite plugs inserted into the composite material. A punch 208 is used, to punch out the plugs 202 from the sheet 204. FIG. 2 is representative in nature, and actual commercial processes for punching out the plugs 202 are readily devised using the teachings of the present disclosure.

Figure 3:
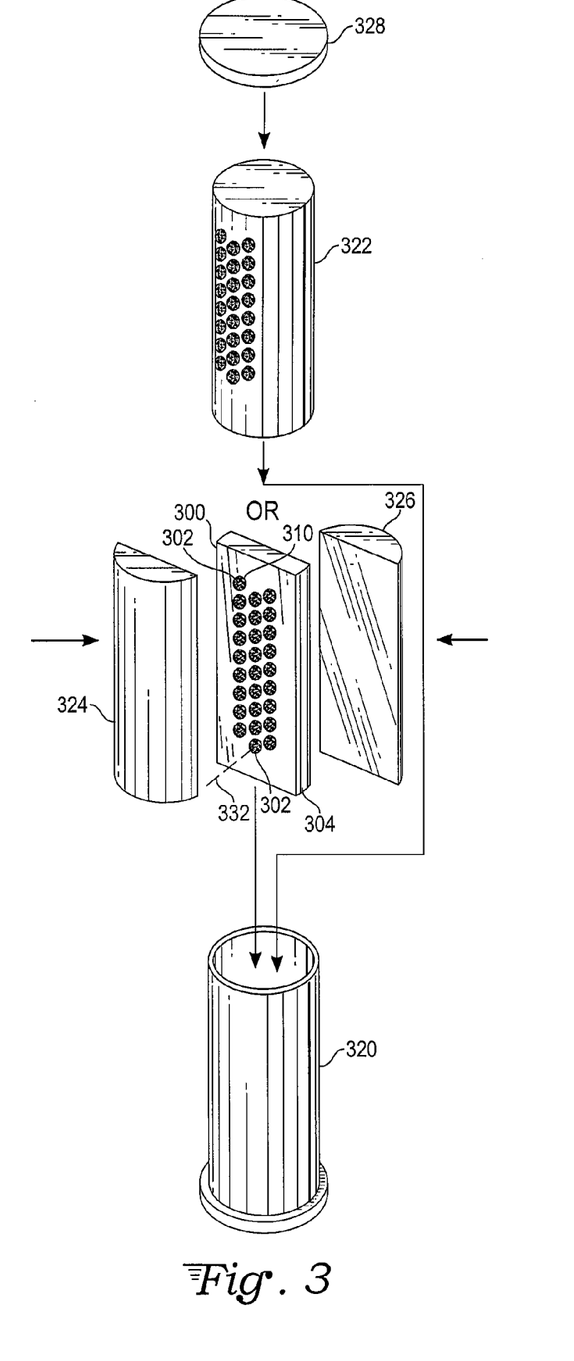
FIG. 3 is a perspective view showing a slab of the composite material of FIG. 1 being prepared for hot isostatic pressing.

With reference to FIG. 3, a slab 300 of the composite material is shown. Thermal pyrolytic graphite plugs 302 are inserted into apertures 310 in a blank 304 made of aluminum beryllium alloy. In one embodiment, the aluminum beryllium alloy starts in billet or other bulk form and is drilled with a series of apertures. In a further embodiment, the aluminum beryllium alloy is molded with the apertures formed by casting or forging in a mold. In further embodiments, depressions are used in place of some or all of the apertures, and the plugs 302 are inserted into the depressions.

Hot isostatic pressing, a generally known industrial process, is herein applied to the disclosed composite material. In a hot isostatic press, high pressure and temperature are applied to a material for a time interval. Pressure within the hot isostatic press is essentially the same in all directions i.e. omnidirectional. The pressing compresses materials together, and can fuse materials.

In the embodiment shown in FIG. 3, the slab 300 of composite material is prepared for hot isostatic pressing by placing the plugged alloy blank 304, i.e. the slab 300 including the plugs 302, into a can 320 and sealing the can 320. In one embodiment, the alloy blank 322 is cylindrical and closely fits the interior of the can. In a further embodiment, the alloy blank 304 is rectangular, and closely fitting shims 324, 326 are temporarily assembled to the plugged blank 304, to be removed after the hot isostatic pressing. The shims 324, 326 are dimensioned so that the alloy blank 304 and the shims 324, 326 when so assembled closely fit the interior of the can 320. Various shims meeting such a specification and fitting various dimensions and shapes of alloy blanks, and various cans or other enclosures are readily devised using the teachings of the present disclosure. In the embodiment shown, the can 320 is sealed under vacuum by screwing on a lid 328, prior to the hot isostatic pressing.

Figure 4:
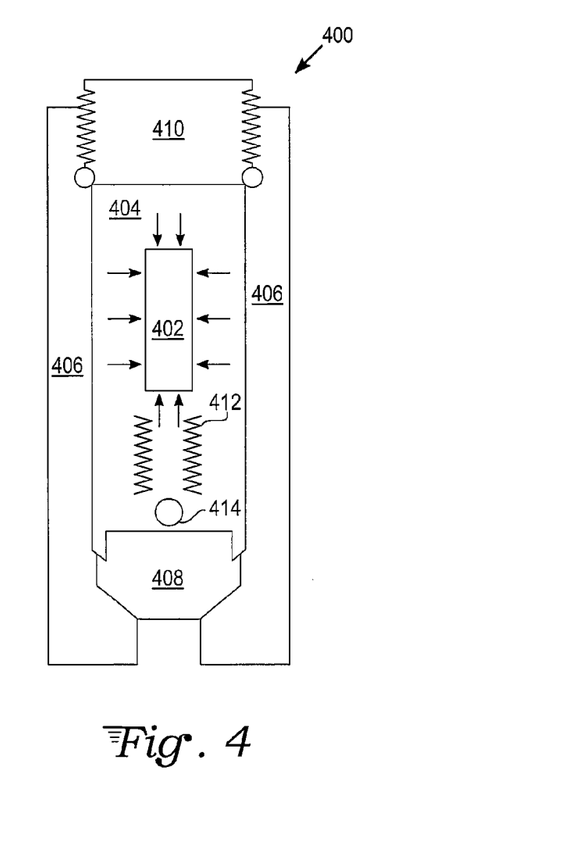
FIG. 4 is a schematic view of a hot isostatic pressing facility, as used in forming the composite material of FIG. 1

With reference to FIG. 4, a hot isostatic pressing facility 400 is shown. The sealed can 402, containing the composite material, is placed in the chamber 404 for consolidation. The can is subjected to high temperature and pressure. The material inside the can 402 is consolidated into a monolithic block. The hot isostatic pressing facility 400 includes chamber walls 406, a bottom closure 408 and a top closure 410, as well as a heating unit 412 and a fan 414 for circulation of the high pressure argon gas within the chamber 404.

Figure 5:
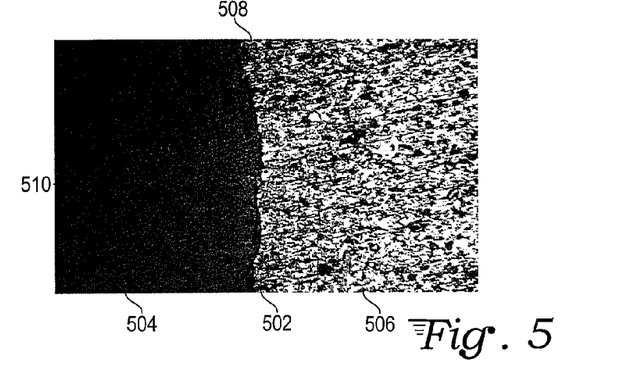
FIG. 5 is a cross-section microscopic view showing the joint integrity at the bonding boundary of the thermal pyrolytic graphite and the aluminum-beryllium alloy, in a sample of the composite material of FIG. 1.

With reference to FIG. 5, a 400-× magnification microscopic view of a cross-section of the thermally conductive composite material 500 is shown. The sample being viewed under the microscope is positioned to show the bonding boundary 502 of the thermal pyrolytic graphite 504 in the aluminum beryllium alloy 506. Joint integrity is visually verified, and no voids or separations are found in the cross-section. Roughness of the perimeter 508 of the thermal pyrolytic graphite plug 510, resulting from the use of a mechanical punch in production of the plugs from the sheet of thermal pyrolytic graphite, is seen in the microscopic view. This roughness is preferred as providing a larger surface area for interface with the eutectic melt and thus a larger bonding area and a greater bond strength. An additional benefit of the roughness is that shear forces from differences in thermal expansion coefficients between the aluminum beryllium alloy and the thermal pyrolytic graphite are more unevenly or randomly distributed to the thermal pyrolytic graphite than would be the case if a polished or smoothed surface of thermal pyrolytic graphite were presented at the bonding boundary. Such more random distribution of shear forces is less likely to result in cleavage of the thermal pyrolytic graphite along planar boundaries of the thermal pyrolytic graphite as compared to such a polished or smoothed surface. Long-term durability of the composite material, over many cycles of thermal expansion and contraction, is thus improved by the use of the rough edges of the thermal pyrolytic graphite plugs 510.

Long-term durability of the composite material is further affected by the choice of aluminum alloy. Aluminum beryllium alloy has a low thermal coefficient of expansion as compared to many other aluminum alloys. Specifically, aluminum beryllium alloy has a lower thermal coefficient of expansion as compared to aluminum 6061T6, a heat tempered aluminum alloy commonly in use in aerospace and other industries. There is less of a difference in thermal coefficient of expansion between aluminum beryllium alloy and thermal pyrolytic graphite as compared to other aluminum alloys, which lowers stresses to the thermal pyrolytic graphite during heat cycles of regular operation, e.g. for a thermal transfer member. Further, aluminum 6061T6 and many other aluminum alloys require a reconditioning heat treatment, such as heating and quenching, after processes involving high heat such as found in hot isostatic pressing. A typical heating and quenching process involves heating an aluminum alloy up to 900° F. to 1000° F. and then dropping the alloy in water. Use of an aluminum alloy that requires heat treatment following the hot isostatic pressing stresses the newly formed composite material by requiring a large heat cycling of the material. Aluminum beryllium alloy does not require such a heating and quenching or other heat treatment following the hot isostatic pressing, and retains the full strength of the alloy afterwards. The use of aluminum beryllium alloy is thus less stressful for the composite material as the large heat cycling of heating and quenching or other heat treatment following hot isostatic pressing is avoided. Further, aluminum beryllium alloy has a higher thermal conductivity than heat-treated aluminum 6061T6. Thus, the choice of aluminum beryllium alloy benefits both the durability and the thermal conductivity of the disclosed composite material. In one embodiment, the beryllium is present in the alloy at about 38%. In further embodiments, the beryllium is present in the alloy in a range of about 20% to about 70%, with the remainder being commercially pure aluminum.

The embodiment shown is produced by subjecting the composite material to a nominal temperature of 1000° F. (about 540 degrees Celsius) and a nominal pressure of 15,000 pounds per square inch (psi) (about 1020 atmospheres, 103 million newtons per square meter or 1520 mega pascals) for two hours. One embodiment is subjected to a temperature of 970° F. (about 520 degrees Celsius). Further embodiments are subjected to a range of plus or minus 25% of the nominal temperature, nominal pressure and nominal time interval values.

At least one embodiment is produced by using thermal pyrolytic graphite plugs at a nominal size of 6 millimeters diameter. Sizes up to 12 millimeters diameter have been tested. Larger sizes could be used, however the difference in thermal coefficient of expansion between aluminum beryllium alloy and thermal pyrolytic graphite is nonzero and larger diameters of plugs are subjected to greater stresses in thermal cycling under regular use than smaller diameters of plugs. Smaller sizes allow greater flexibility and denser nesting of the plugs in assemblies, for example around bolt interfaces, apertures and curved surfaces. Further cross-section shapes are envisioned for the thermal pyrolytic graphite plugs. A circular cross-section provides the most symmetric distribution of forces arising from the difference in thermal coefficient of expansion between the thermal pyrolytic graphite and the aluminum beryllium alloy. However, a noncircular cross-section provides a larger ratio of surface area to volume of the thermal pyrolytic graphite, which provides a larger bonding area for a specified mass or volume of a plug. Whether a circular or a noncircular cross-section is used for a thermal pyrolytic graphite plug, a maximum cross-section dimension that is less than or equal to 12 millimeters is recommended.

With reference to FIGS. 6-10, embodiments of an example product are shown, as using the thermally conductive composite material. The example product is a heat transfer member.

Figure 6:
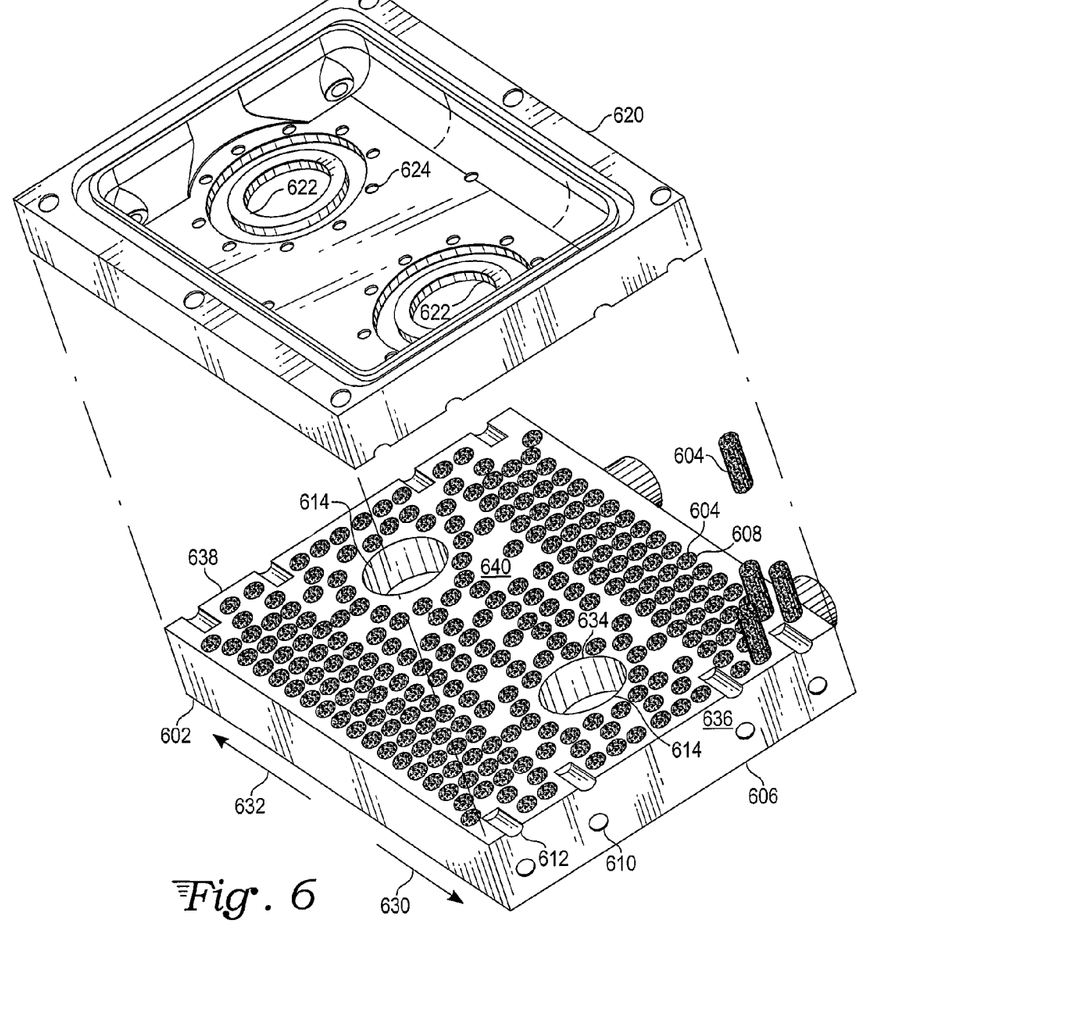
FIG. 6 is a perspective exploded view of an interface top plate mating to a receiver plate. The receiver plate is a thermal transfer member made of the composite material of FIG. 1.

With reference to FIG. 6, a receiver plate 602 is a thermal transfer member having thermal pyrolytic graphite inserts 604 in an aluminum beryllium alloy member 606. Each of the thermal pyrolytic graphite inserts 604 is a plug located in an aperture 608 that extends through the aluminum beryllium alloy member 606. The aluminum beryllium alloy member 606 has further apertures 610 or depressions 612 for fasteners. Still further apertures 614 in the aluminum beryllium alloy member 606 are formed for receiving a thermal load (not shown) as a heat source device.

With further reference to FIG. 6, an interface top plate 620 has corresponding apertures 622 for receiving a thermal load, and mates to the receiver plate 602. Further apertures 624 are provided in the top plate for fasteners. The interface top plate 620 is made of aluminum beryllium alloy so as to match the thermal coefficient of expansion of the receiver plate 602.

Figure 7:
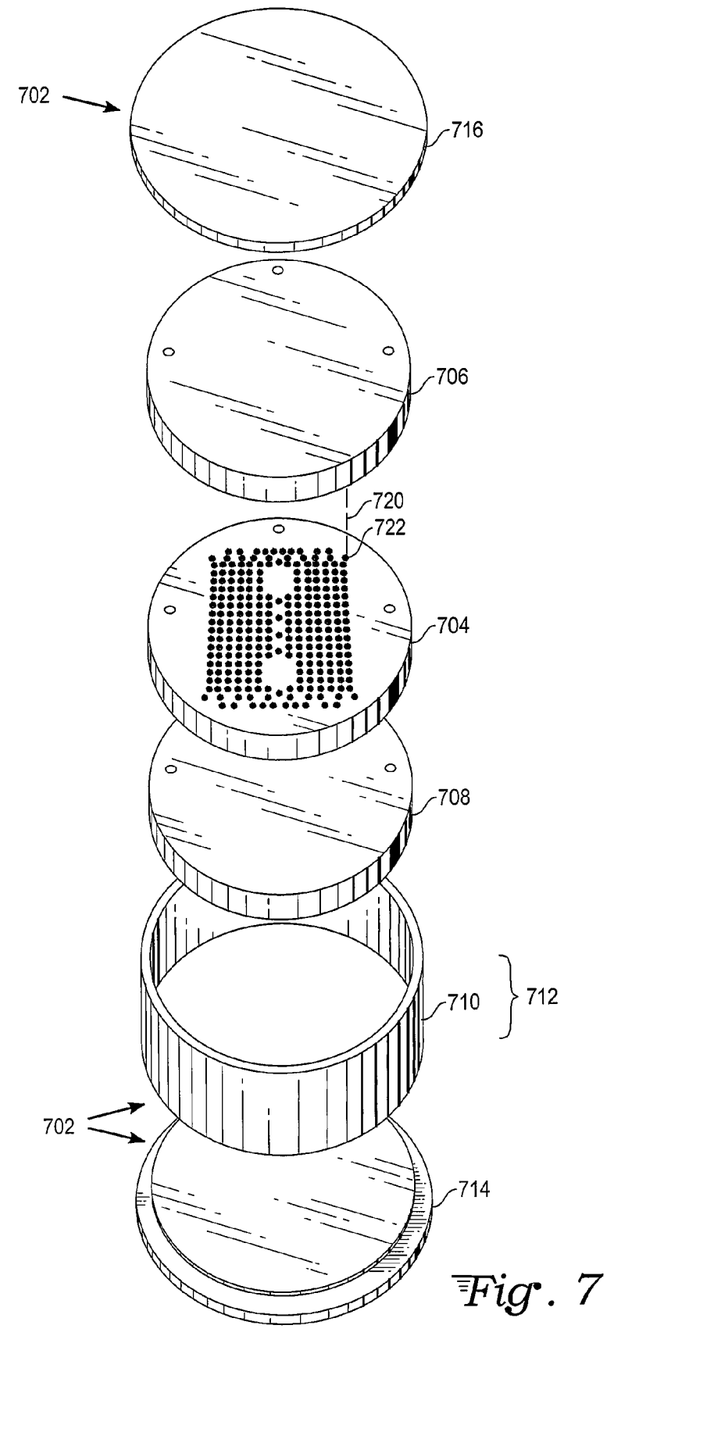
FIG. 7 is a perspective exploded view showing an apparatus for preparing the thermal transfer member of FIG. 6.

With reference to FIG. 7, an exploded view shows a can 702, a blank 704 and shims 706, 708 as used in preparing the composite material for hot isostatic pressing. The can 702 has cylindrical walls 710 in a midsection 712, a bottom lid 714 and a top lid 716. The blank 704 is sandwiched by an upper shim 706 and a lower shim 708. In this embodiment, the central axes 720 of the thermal pyrolytic graphite plugs 722 are oriented parallel to the walls 710 of the midsection 712 of the can 702 and perpendicular to the lids 714, 716 of the can 702. By comparison, in the embodiment shown in FIG. 3 the central axes 332 of the plugs 302 are oriented parallel to the lids 328, 330 of the can 320.

Figure 8:
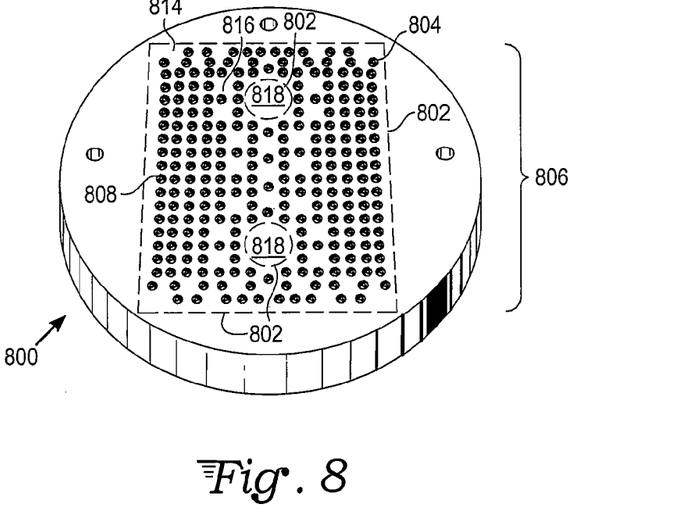
FIG. 8 is a perspective view showing the prepared thermal transfer member as removed from the apparatus of FIG. 7, indicating machining cuts for producing the finished thermal transfer member of FIG. 6.

With reference to FIG. 8, the composite material is removed from the can following the hot isostatic pressing, and is now a prepared material 800. Machining cuts 802 are indicated (in dashed line) on the prepared composite material 800. Removing material from the blank, by performing the machining cuts 802 as indicated, results in the finished thermal transfer member of FIG. 6, i.e. the receiver plate 602. Material is removed by drilling, cutting and/or other machining operations as known in the art.

With continued reference to FIG. 8, the thermal pyrolytic graphite plugs 804 are arranged in a two-dimensional array 806. A portion of the array 806 is regular, such as the square or rectangular array 808 shown. Further embodiments use a staggered rows arrangement for the regular portion of the array, and still further arrangements in a regular array are readily devised. A further portion 810 of the array is irregular. The irregularly spaced plugs 812 provide regions 814, 816, 818 that are free of plugs. In the plug-free regions 814, 816, 818 space is provided for forming apertures or depressions for fasteners. In the plug-free regions 818, space is provided for forming apertures or depressions for insertion of heat producing members or other devices.

Figure 9:
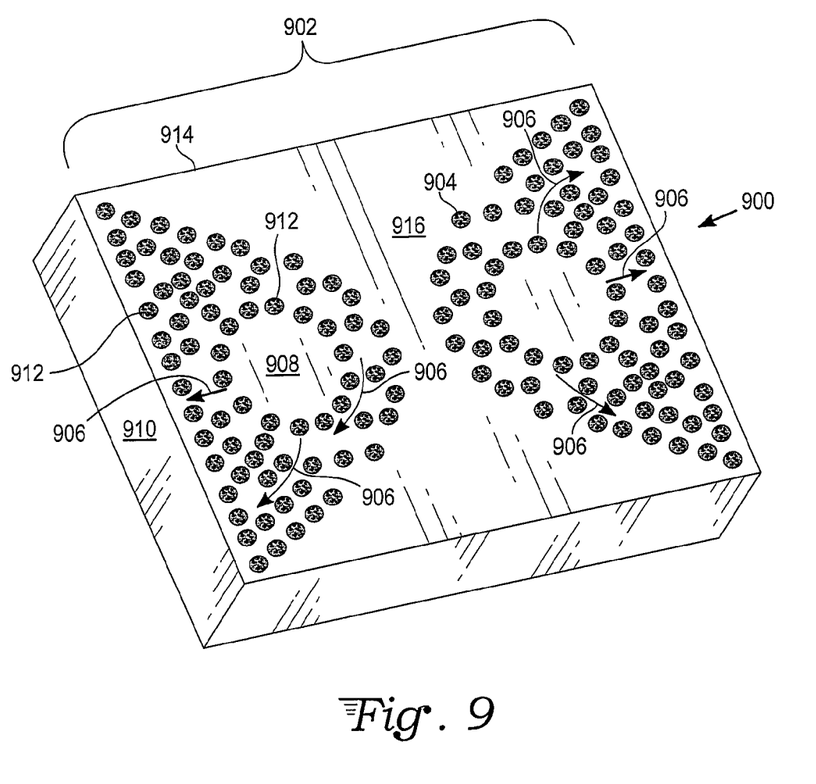
FIG. 9 is a perspective view of an alternative embodiment of the thermal transfer member of FIG. 6, prior to further machining.

With reference to FIG. 9, a further embodiment of the composite material 900 is shown, and has an irregular array 902 of the thermal pyrolytic graphite plugs 904. The composite material 900 can be further machined to produce a finished component. In the embodiment shown, the plugs 904 are arranged to direct thermal conductivity along one or more thermal conduction paths 906. As a result of the placement of the thermal pyrolytic graphite plugs 904, heat travels across the plugs in succession and travels through the aluminum beryllium alloy between plugs. Thus, in contrast to how heat travels in a continuous extent of thermal pyrolytic graphite, major thermal conduction paths in the composite material 900 traverse or go across plural thermal pyrolytic graphite members and the boundaries between such members in series. In other words, major thermal conduction paths in the composite material 900 traverse plural discontinuous extents of the thermal pyrolytic graphite, in succession. The thermal conductivity is directed by the plugs 912 from a location 908 of a heat source to an end face 910 of the aluminum beryllium alloy member 914. In one example, a heat pipe (not shown) is connected to the end face 910 of the aluminum beryllium alloy member 914, and acts as a heat removing unit. The end face 910 to which the heat pipe is connected becomes a heat rejection surface.

Returning to FIG. 6, the embodiment of the composite material shown in the thermal transfer member, i.e. the receiver plate 602, provides thermal conduction paths 630, 632 from a location 634 for a heat source (not shown) to both a first end 636 face and a second end face 638. In contrast to the embodiment shown in FIG. 9, the composite material in the thermal transfer member of FIG. 6 has greater system reliability in a circumstance in which there is a failure of one of two heat pipes connected to opposing end faces.

With reference to FIGS. 1, 6 and 9, the arrangement of the thermal pyrolytic graphite members in the aluminum beryllium alloy defines at least one major thermal conduction plane in embodiments of the composite material and thermal transfer devices. In FIG. 1, the composite material 100 has a direction 108 of heat transfer that is parallel to the surface 112 of the composite material 100. The surface 112 of the composite material 100 defines a major thermal conduction plane for the composite material 100, as do midplanes (not shown) that parallel the surface 112. These major thermal conduction planes intersect the majority or all of the thermal pyrolytic graphite plugs 102. Minor thermal conduction planes can be defined perpendicular to the thermally conductive planes of graphene in the thermal pyrolytic graphite plugs 102. In this example, the minor thermal conduction planes are perpendicular to the surface 112 of the composite material 100. Thermal conductivity is much lower in the minor thermal conduction planes than in the major thermal conduction planes.

In FIG. 6, the receiver plate 602 has thermal conduction paths 630, 632 through the composite material. The thermal conduction paths 630, 632 are in parallel with a front surface 640, which defines a major thermal conduction plane for the composite material and for the thermal transfer device. Similarly, the rear surface (not shown) and various mid-planes of the material (not shown) define further major thermal conduction planes in parallel with the front surface 640. In this example, these major thermal conduction planes intersect all of the thermal pyrolytic graphite inserts 604.

In FIG. 9, the composite material 900 has thermal conduction paths 906 in parallel with a front surface 916 of the composite material 900. The front surface 916 of the composite material 900 defines a major thermal conduction plane, as do further parallel midplanes and the back surface (not shown) of the composite material 900. The front surface 916 of the composite material 900 intersects all of the thermal pyrolytic graphite plugs 912. In this example, any of these major thermal conduction planes intersect all of the thermal pyrolytic graphite plugs 912.

In the above examples, at least one major thermal conduction path is parallel to or on a major thermal conduction plane of the composite material or the thermal transfer device. The thermal pyrolytic graphite members are arranged so that the thermal conductive planes of graphene in each thermal pyrolytic graphite member are parallel to the thermal conductive planes of graphene in the other thermal pyrolytic graphite members. A major thermal conduction plane of the composite material or of a thermal transfer device is defined by this alignment of the thermal conductive planes of the thermal pyrolytic graphite members. This major thermal conduction plane of the composite material or the thermal transfer device intersects a majority or all of the thermal pyrolytic graphite members. In further embodiments, surfaces of the composite material or the thermal transfer device have various dimensions and configurations and are not necessarily parallel to other specified surfaces, nor are major thermal conduction planes necessarily parallel to a specified surface. For example, the alloy blank 322 in FIG. 3 does not have a planar front surface or back surface, yet a major thermal conduction plane can be defined along a midplane through the composite material being formed with the alloy blank 322, in accordance with the above principles. By having a thermal conduction plane that intersects a majority or all of the discreetly arranged thermal pyrolytic graphite members, a major thermal conduction path along or parallel to such a thermal conduction plane can traverse the plural discontinuous extents of the thermal pyrolytic graphite, as discussed regarding FIG. 9. Still further embodiments are envisioned with curved, compound or geometric surfaces wherein the above principles apply locally.

Figure 10:
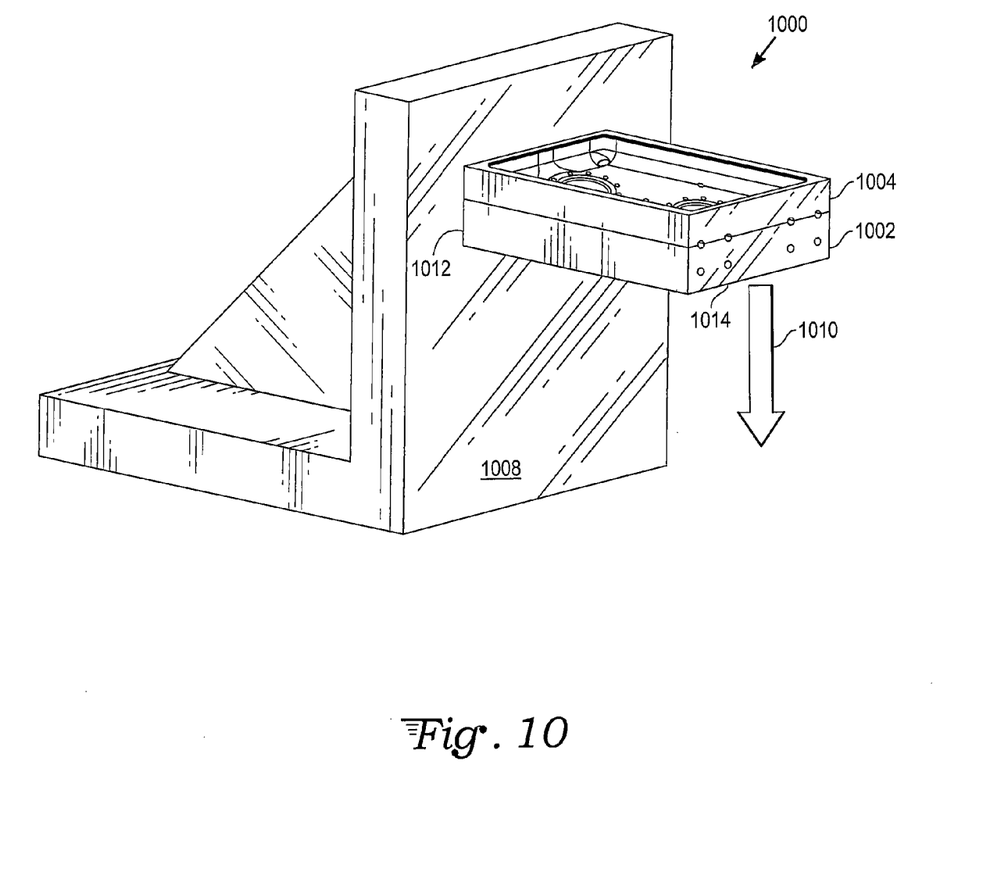
FIG. 10 is a perspective view showing load testing of the assembled interface top plate and receiver plate of FIG. 6.

With reference to FIG. 10, mechanical load testing 1000 of the assembled receiver plate 1002 and interface top plate 1004 shows the composite material has much greater strength than does thermal pyrolytic graphite alone, and has strength approaching that of the aluminum beryllium alloy. For load testing, the assembled plates 1006 are attached at one end 1012 to a load testing fixture 1008, a load is applied to the opposing end 1014 of the assembled plates 1006, and a downward deflection 1010 is measured at the end 1014. Measurement results are compared to the results of load testing a similar assembly (not shown) of aluminum beryllium alloy without the plugs. The composite material has strength approaching that of the original aluminum beryllium alloy as a result of the consolidation of the materials from the hot isostatic press treatment, the eutectic alloy created with the use of silicon in the liquid interface diffusion bonding process, the metallurgical bond formed by the combination of thermal pyrolytic graphite, aluminum beryllium alloy and silicon, and the use of aluminum beryllium alloy with apertures as a matrix or framework for the plugs.

Figure 11:
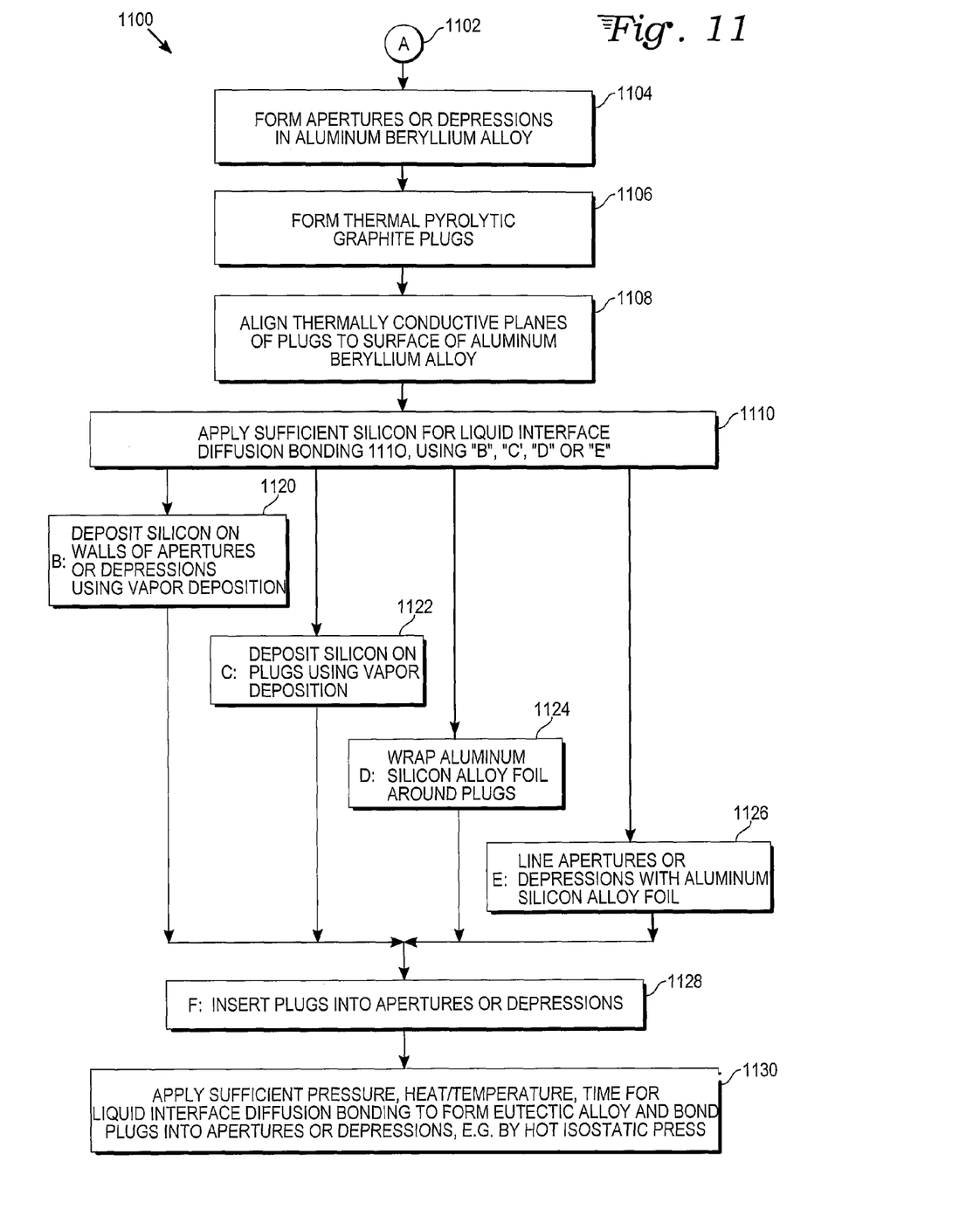
FIG. 11 is a flow diagram of a method for making the thermally conductive composite material of FIG. 1.

With reference to FIG. 11, a method 1100 for making a thermally conductive composite material is shown. The method 1100 is suitable for making embodiments of the disclosed thermally conductive composite material and embodiments of the thermal transfer member.

In a block 1102, the method 1100 begins at entry point "A". In a block 1104, apertures or depressions are formed in the aluminum beryllium alloy. The apertures or depressions may be formed by drilling or other machining processes, or molding or casting. In a block 1106, thermal pyrolytic graphite plugs are formed. The plugs may be formed by repeated punching of sheets of thermal pyrolytic graphite. In a block 1108, thermally conductive planes of the thermal pyrolytic graphite plugs are aligned to a surface of the aluminum beryllium alloy. The surface may be a front surface or a back surface of the aluminum beryllium alloy, e.g. of a block, a slab, a blank, or a billet of the alloy. This alignment may be arranged by using sheets of thermal pyrolytic graphite with graphene planes parallel to the major surfaces of the sheets when punching out the plugs, and forming apertures or depressions in the aluminum beryllium alloy with major axes perpendicular to the surface of the aluminum beryllium alloy. In a block 1110, sufficient silicon is applied for liquid interface diffusion bonding. The silicon is applied using a selected branch to branch point "B", "C", "D" or "E". In a block 1120, at branch point "B", silicon is deposited on walls of the apertures or depressions of the aluminum beryllium alloy, using vapor deposition. In a block 1122, at branch point "C", silicon is deposited on the thermal pyrolytic graphite plugs, using vapor deposition. In a block 1124, at branch point "D", aluminum silicon alloy foil is wrapped around the thermal pyrolytic graphite plugs. In a block 1126, at branch point "E", the apertures or depressions in the aluminum beryllium alloy are lined with aluminum silicon alloy foil. Following the selected operation at branch point "B", "C", "D" or "E", flow proceeds to reentry point "F". In a block 1128, at reentry point "F", the thermal pyrolytic graphite plugs are inserted into the apertures or depressions in the aluminum beryllium alloy. In a block 1130, sufficient pressure, heat and temperature, and time are applied in order for liquid interface diffusion bonding to form a eutectic alloy and metallurgically bond the thermal pyrolytic graphite plugs into the apertures or depressions in the aluminum beryllium alloy. For example, a hot isostatic press may be used.

Tests performed on an example of the thermally conductive composite material show a thermal conductivity that is about four times as great as the thermal conductivity of aluminum 6061T6 alloy, and a mass that is almost 20% lower. The thermal pyrolytic graphite in the aluminum beryllium alloy substantially increases the thermal conductivity, producing a much lower temperature difference between warm loads and heat rejection surfaces. Overall mass and physical strength of the composite material, and directionality of the thermal conductivity, can be controlled by the dimensions, spacings and locations of the thermal pyrolytic graphite plugs. This enabling technology provides a passive thermal control solution while supporting structural requirements. In cryocoolers, the thermally conductive composite material will significantly reduce the mass of the system and reduce the required input power for a given cooling load. A reduced compressor size may also reduce vibration in the cooling system. Such compound effects may increase reliability of the system.

What is claimed is:

1. A thermally conductive composite material comprising:
   an aluminum or aluminum alloy member;
   discrete plugs of thermal pyrolytic graphite embedded within a plurality of apertures formed in the aluminum or aluminum alloy member; and
   an eutectic alloy interface produced by a process comprising a thin layer of silicon of an interface location of said aluminum or aluminum alloy member and said discrete plugs of thermal pyrolytic graphite and then using elevated temperature and pressure to bond said aluminum or aluminum alloy member and said discrete plugs of thermal pyrolytic graphite together at said eutectic alloy interface securing the plugs to the aluminum or aluminum alloy member and formed by the aluminum or aluminum alloy, the thermal pyrolytic graphite and silicon, total residual silicon material after elevated temperature diffusion bonding limited to a thin region of at most 50 microns around each graphite plug.

2. The composite material of claim 1 wherein the aluminum or aluminum alloy member is made of aluminum beryllium alloy.

3. The composite material of claim 1 wherein each of a majority of the plugs of thermal pyrolytic graphite has a maximum cross section dimension that is less than or equal to twelve millimeters.

4. The composite material of claim 1 wherein:
   the aluminum or aluminum alloy member is in the form of a blank having depressions therein or apertures therethrough; and
   the plugs occupy the depressions or apertures and are bonded thereto by the eutectic alloy.

5. The composite material of claim 1 wherein the plugs are in a two-dimensional array.

6. The composite material of claim 1 wherein a plurality of the plugs are irregularly arranged.

7. The composite material of claim 1 including at least one plug-free region of the aluminum or aluminum alloy.

8. The composite material of claim 1 including at least one aperture or plug-free depression.

9. A thermal transfer device comprising:
   an aluminum or aluminum alloy member; and
   a plurality of thermal pyrolytic graphite plug members embedded in a plurality of apertures formed at selected positions in the aluminum or aluminum alloy member and bonded thereto;
   wherein thermally conductive planes of the thermal pyrolytic graphite plug members are substantially parallel such that at least one major thermal conduction path is presented that traverses plural ones of the thermal pyrolytic graphite plug members and boundaries therebetween in series;
   wherein the thermal pyrolytic graphite members are metallurgically bonded to the aluminum or aluminum alloy member by an eutectic alloy formed by a process including providing an application of a thin layer of silicon at respective interfaces between the thermal pyrolytic graphite plug members and the aluminum or aluminum alloy member followed by a diffusion bonding these elements at elevated temperatures forming aluminum-silicon and silicon carbide at the interfaces, with total residual silicon material after elevated temperature diffusion bonding being limited to a thin region of at most 50 microns around each graphite plug member.

10. The thermal transfer device of claim 9 wherein the aluminum or aluminum alloy member is an aluminum beryllium alloy member.

11. The thermal transfer device of claim 9 wherein:
the thermal pyrolytic graphite members are arranged such that a major thermal conduction plane of the thermal transfer device intersects a majority of the thermal pyrolytic graphite members and is parallel to the thermally conductive planes thereof, and
the at least one major thermal conduction path is parallel to or on the major thermal conduction plane.

\* \* \* \* \*